(12) United States Patent
Buescher et al.

(10) Patent No.: US 7,560,989 B2
(45) Date of Patent: Jul. 14, 2009

(54) POWER AMPLIFIER WITH CONTROLLED OUTPUT POWER

(75) Inventors: Kevin Scott Buescher, Colorado Springs, CO (US); Matthijs Pardoen, Pompertuzat (FR)

(73) Assignee: EM Microelectronic-Marin S.A., Marin (CH)

( * ) Notice: Subject to any disclaimer, the term of this patent is extended or adjusted under 35 U.S.C. 154(b) by 12 days.

(21) Appl. No.: 11/745,891

(22) Filed: May 8, 2007

(65) Prior Publication Data

US 2008/0278239 A1    Nov. 13, 2008

(51) Int. Cl.
*H03F 3/10* (2006.01)
(52) U.S. Cl. .................................... 330/284; 330/295
(58) Field of Classification Search ............. 330/124 R, 330/285, 286, 295, 311, 284
See application file for complete search history.

(56) References Cited

U.S. PATENT DOCUMENTS

| 6,778,015 B2 * | 8/2004 | Ogawa ....................... 330/286 |
| 2007/0085602 A1 * | 4/2007 | Park et al. .................... 330/51 |

* cited by examiner

*Primary Examiner*—Khanh V Nguyen
(74) *Attorney, Agent, or Firm*—Griffin & Szipl, P.C.

(57) ABSTRACT

The invention includes a power amplifier with an amplifier core including parallel amplifier cells, a replica cell made of one amplifier cell similar to those of the amplifier core, a power controller to select a combination of amplifier cells to activate, a regulator to fix the top voltage of the replica cell to a reference voltage, a voltage generator to provide the voltage reference to the regulator, a current generator to provide a reference current through the replica cell, and a drive unit controlled by the regulator output to drive the combination of amplifier cells, so that each selected combination of activated cells defines a predetermined attenuation level of power amplifier output signal so that it is attenuated in a stepwise manner.

13 Claims, 2 Drawing Sheets

POWER AMPLIFIER WITH CONTROLLED OUTPUT POWER

FIELD OF THE INVENTION

The present invention generally relates to RF power devices, in particular to power amplifiers with a controlled output power.

BACKGROUND OF THE INVENTION

Product manufacturers have a need to control output power from RF power devices. This allows them to optimize performances such as transmission range and battery life and at the same time not to violate government regulations dealing with power emissions. For that purpose, power amplifiers known in the art are usually based on methods that control gate or base drive, adjust bias current or parallel devices together to perform power control.

Nevertheless existing power amplifier control techniques are sensitive to temperature, manufacturing process tolerances and power supply voltage variations.

SUMMARY OF THE INVENTION

One goal of the present invention is thus to carry out a reliable and simple controlled power amplifier which overcomes the drawbacks of the prior art. For that purpose, it is provided with power control by controlling DC current in a replica device as well as using parallel devices to obtain a stepwise power control. The power amplifier according to the present invention therefore comprises an amplifier core including parallel amplifier cells, a replica cell made of one amplifier cell similar to those of the amplifier core, a power controller to select a combination of amplifier cells to activate, a regulator to fix the top voltage of the replica cell to a reference voltage, a voltage generator to provide the voltage reference to the regulator, a current generator to provide a reference current through the replica cell and a drive unit controlled by the regulator output to drive the combination of amplifier cells, wherein each selected combination of activated cells defines a predetermined attenuation level of power amplifier output signal so that it is attenuated in a stepwise manner. Thus temperature, manufacturing process tolerances and power supply voltage variations may be all minimized.

According to an advantageous embodiment, the power controller selects the reference current between a defined number of current levels to attenuate said power amplifier output signal with a corresponding number of attenuation levels.

According to another advantageous embodiment, combinations of activated cells define rough attenuation steps and each current level of said current reference defines a fine attenuation step.

Other advantageous embodiments of the power amplifier form the subject of the dependent claims.

Another object of the present invention concerns a method to control the power output of a power amplifier.

BRIEF DESCRIPTION OF THE DRAWINGS

Other aspects, features and advantages of the present invention will be apparent upon reading the following detailed description of non-limiting examples and embodiments made with reference to the accompanying drawings.

DETAILED DESCRIPTION OF THE INVENTION

Figure 1:
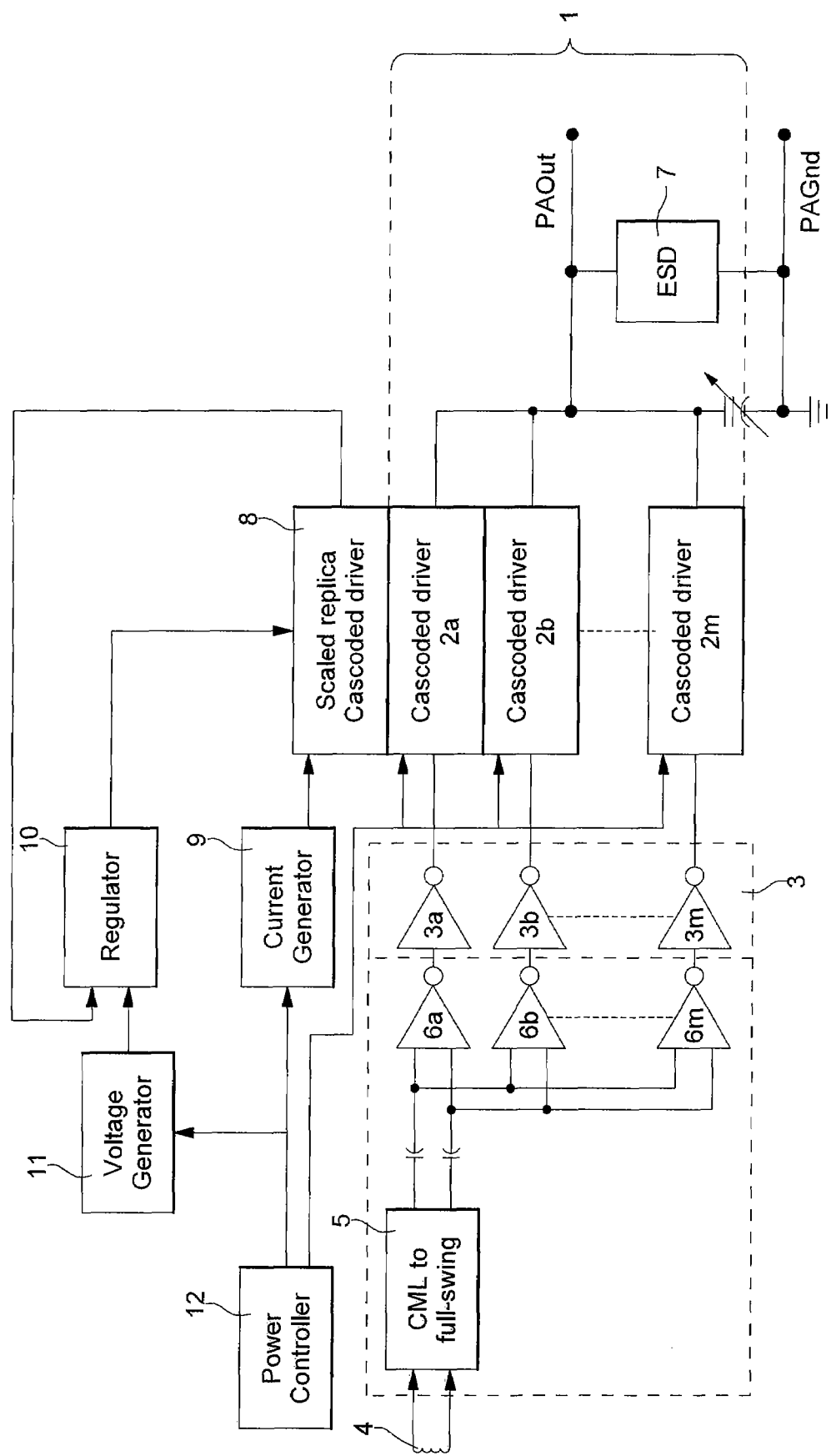
FIG. 1 shows the overall block diagram of the power amplifier.
Figure 2:
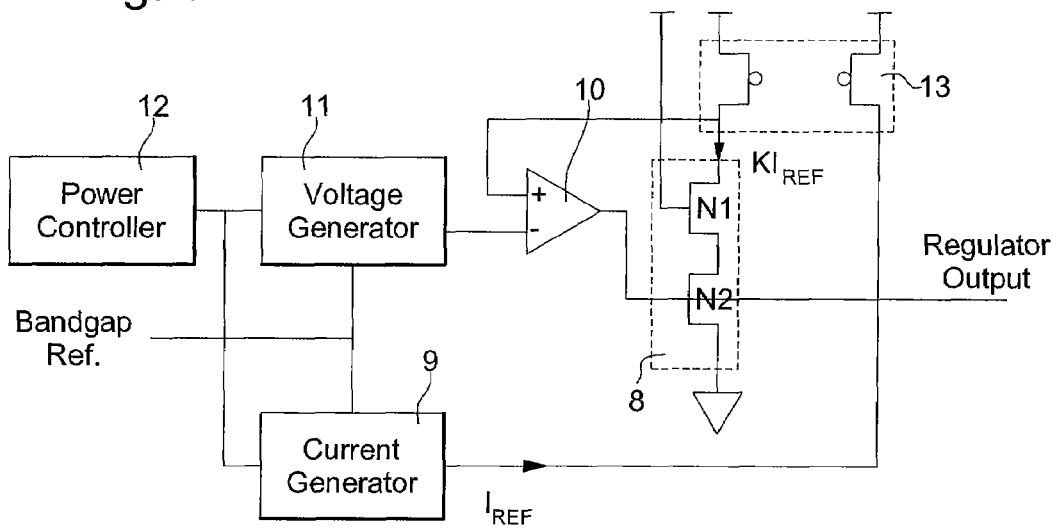
FIG. 2 shows the voltage regulator arrangement.
Figure 3:
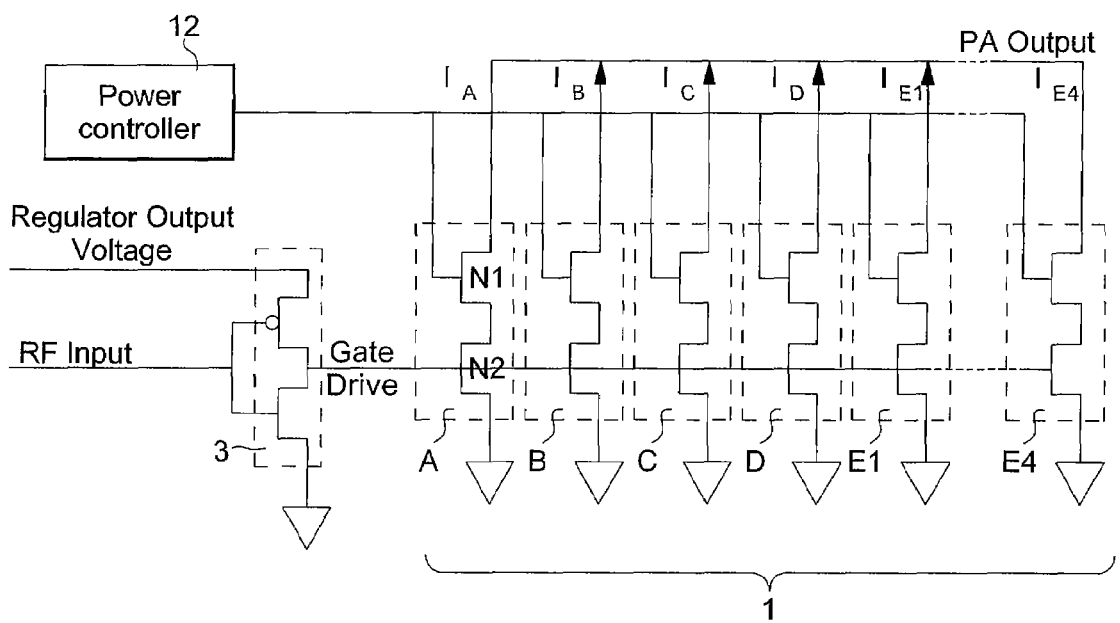
FIG. 3 shows the power amplifier core arrangement.

The following description of a power amplifier with control output power is given by way of a non limiting example in relation with FIGS. 1 to 3.

FIG. 1 shows the overall block diagram of the power amplifier according to a preferred embodiment of the invention. The power amplifier core 1 consists in parallel amplifier cells 2a-2m, preferably cascoded amplifiers or as labelled "cascoded drivers" each being controlled by the means of a corresponding drive gate 3a-3m. When operating the amplifier core 1 functions as a class C type amplifier by pulling current from a load during a portion of one period of the output frequency, e.g. an antenna 4 connected at the terminals of a Current-Mode Logic to full swing unit 5 connected in turn to inverters 6a-6m to distribute the pulled load to amplifier core 1 via drive gates 3a-3m. The current pulled from load 4 may be controlled by the amplitude and/or width of the pulse on the drive gate 3a-3m of cascoded drivers 2a-2m. In fact, in this circuit the output power is advantageously controlled both by the number of cascoded drivers 2a-2m activated in parallel and the amount of driver's gate drive. It is to be noted that in the represented example, no specific means have been implemented to control the gate pulse width, but they could however be implemented to give another adjustment parameter of the power output. At the output of the amplifier core 1, it is preferably provided with an ESD protection circuit to prevent electrostatic discharge.

The main idea behind the present invention is to use a scaled replica cell 8, similar to any of amplifier cells 2a-2m of the amplifier core, in order to sink current from a current source 9. By monitoring and controlling the current through replica cell 8 a proportional current is to be expected to flow through amplifier core 1, namely the cascoded drivers. This is accomplished by using a feedback circuit around the replica that will be explained in more detailed in liaison with FIG. 2. This feedback loop comprises a voltage regulator 10 to fix the top voltage of replica cell 8 to a reference voltage provided by a voltage generator 11.

In order to obtain the desired attenuation level at the power amplifier output, a power controller 12 selects a combination of amplifier cells to activate. The desired power level is determined by a codeword which defines the combination of amplifier cells 2a-2m to be activated and adjustments of the current and voltage references if needed. Each combination of activated amplifier cells defines a predetermined attenuation level of the power amplifier output signal so that it may be attenuated in a stepwise manner according to the selected combination.

As already mentioned above, a drive unit 3 including drive gates 3a-3m, e.g. inverters, connected to corresponding cascoded drivers is controlled by the regulator output to drive the amplifier cells. This is accomplished by using the regulator output as the voltage source of the inverters of drive unit 3 that are used to drive the cascoded drivers. Advantageously, as it will be explained later on, the current reference may be programmed by power controller 12 with a defined number of current levels in order to finely attenuate the power amplifier output signal with a corresponding number of attenuation levels.

Thus, it is advantageously first combinations of activated cells for defining rough attenuation steps and several current levels of the current reference for defining fine attenuation steps. Furthermore, the power controller may adjust the reference voltage to compensate voltage variations at the power amplifier output. Another power control may be achieved by controlling the level of the voltage swing on the drive gates of the amplifier core. This is accomplished by controlling the output voltage of the regulator that is used to provide the supply voltage to the inverters also used as preamplifiers. This effectively causes the output signal swing of these inverters to toggle between ground and the regulator output voltage level.

One will now describe how the power control of such a power amplifier works in view of FIGS. 2 and 3 showing the voltage regulator arrangement, respectively, the amplifier core arrangement.

FIG. 2 shows the voltage regulator arrangement which is the heart of the power control design. The regulator output voltage is controlled via a feedback loop tied to the scaled replica cell 8. The regulator output voltage is adjusted until the current $kI_{REF}$ flowing through the replica is at the desired level. This method causes related currents ($I_A, I_B, \ldots, I_M$) to flow through the amplifier core (see in FIG. 3). Strictly speaking this controls the output current rather than the output power. However since current and power are related according to the following expression $P=I^2*R$, therefore the output power is indirectly controlled if a proper chosen load resistance is used. It is to note that a conversion factor is used because the current through the replica cell is a DC current and the current at the power amplifier output is an RMS current.

The regulator 12, namely in this example a voltage comparator, is used to fix the voltage at the top of the replica cell 8 to a selected reference voltage $V_{REF}$ provided by the voltage generator 11. Additionally the current generator 9 is used to provide a selected current $I_{REF}$ for the replica cell. The power controller 12 is used to adjust both the selected voltage reference and the selected current reference. The output of the regulator voltage known as the regulator output voltage is then distributed-to provide the supply voltage for the preamplifier inverters 3a-3m as will be shown in FIG. 3. As already mentioned and will be seen later on again, the main power control is accomplished by switching in parallel a combination of selected amplifier cells to define a rough attenuation. In addition, to more finely adjust the attenuation of the power amplifier output signal, the current generator advantageously delivers several different current levels, e.g. four current levels, under request of the power controller allowing such fine attenuation step, e.g. 1 dB increment. Thus the power amplifier output signal may be attenuated in a fine stepwise manner, in this example by 4 dB with 1 dB step, by controlling the current flowing through the replica device so that it causes the regulator voltage to adjust its output voltage until it equalizes this current. In summary this current level adjusts the supply voltage reference for the inverters.

In the represented example, the replica cell is advantageously a cascoded driver comprising two transistors N1 and N2 connected in a cascode arrangement where transistor N1 is present to limit the voltage on N2. The current flowing through the replica cell corresponds to the reference current mirrored in a current mirror 13 with an adequate coefficient k.

Minimum channel length transistors are both used for the replica cell and the similar cells in the amplifier core to allow the highest frequency operation. However, these cascoded drivers exhibit poor output impedance and thus the voltage on the drain of the top of each cell affects the current flowing through and cause it varies based on the source to drain voltage, which consequently affects the output power. Thus, in order to minimize this effect the feedback path around the replica cell not only controls the current through the replica but also the voltage on the drain of transistor N1. The voltage regulator output controls the gate of transistor N2 of the replica in function of the comparison between the voltage at the top of the replica cell and the voltage reference. The amplifier adjusts the gate level of the replica until the voltage at the source of the replica cascode is equal to the generated voltage level of the voltage generator. This arrangement eliminates the current variations caused by the voltage present at the source of the cascode. This DC voltage is advantageously designed to approximate the lowest voltage seen at the power amplifier output for a given power setting. This corrects for a second order effect the output impedance.

Therefore there are two main factors that are used to set the output power. The first factor is the current ratio flowing through the amplifier core controlled by the power controller for attenuating the power of the output signal and advantageously use of a variable current generator for a fine attenuation. This first factor allows better power control because the current variations due to the source to drain voltage are dramatically reduced. The second factor is the voltage generator used for fixing the output voltage of the replica cell further which allows approximating the RMS voltage present at the power amplifier output.

Finally referring to FIG. 2, it is to be noted that in the represented embodiment the reference current and reference voltage are generated internally using a bandgap reference. However, another method would be to use an external resistor for example to obtain a more precise and/or flexible solution.

Turning now to FIG. 3, it shows the amplifier core arrangement. The regulator output from FIG. 2 is applied to the drive unit 3 constituted by inverter preamplifier(s) which in turn sets the maximum gate drive voltage. As temperature, process parameters, etc. change the drive voltage level, the gate drive voltage also changes to lessen their effects. Actually, as shown, inverters of the drive unit 3 driven by the regulator output along with the power controller instructions are used in turn to drive the gates of the parallel cascoded drivers of the amplifier core 1.

According to the power controller instruction used to turn on and off each selected cells, namely the different cascoded drivers (A,B,C,D, E1-E4), to be activated or deactivated so that its achieves a defined combination of amplifier cells with the desired power. In the represented preferred embodiment, 4 dB attenuation is already controlled by the current level (i.e. gate drive) as explained in relation with FIG. 2. Then each selected combination allows 4 dB step attenuation by switching in or out the drivers. However, it should be noticed that it is also possible to divide the current control versus combination of parallel drivers in a different ratio than four to one.

According to the desired overall power amplification, an adequate scaling size is chosen between the replica cell and the number of parallel drivers. This choice should take into account the fact that the output power is related to the reference current and the scale factor according to the following expression:

Output power=$(f(Iref)*1/\text{scale factor})^2*$Output impedance;

Further, according to the desired attenuation range, for instance for an attenuation range of 32 dB, an adequate number of amplifier cells with adequate ratios is chosen. One advantageous implementation includes one 4X driver (A), two 2X drivers (B and C), one 1X driver (D) and one ½X driver (E1), one ¼X driver (E2) and two ⅛X drivers (E3 and E4), where X corresponds to the number of times the reference current flows in each of the driver blocks ($I_A$ through $I_{E4}$). The output power is then related to the sum of currents flowing through the activated cells multiplied by the scaling size inverse.

Below is given one example of attenuation control with a codeword controlled by the power controller where the three first bits correspond to a rough attenuation (e.g. with a 4 dB step) obtained with different combinations of activated cells, and the last two bits correspond to a fine attenuation (e.g. with a 1 dB step) obtained with different reference current levels.

| Attenuation dB | Codeword | Implemented ratio | Activated cells | Current level | Error % |
|---|---|---|---|---|---|
| 0 | 000 00 | 10 | All cells | Max | 0 |
| 1 | 000 01 | 10 | All cells | Next to max | 0 |
| 2 | 000 10 | 10 | All cells | Next to min | 0 |
| 3 | 000 11 | 10 | All cells | Min | 0 |
| 4 | 001 00 | 6.25 | A, B, E1, E2 | Max | −0.8 |
| 8 | 010 00 | 4 | A or B, C | Max | 0 |
| 15 | 011 11 | 2.5 | B, E1 | Min | 0 |
| 24 | 110 00 | 0.625 | E1, E3 | Max | −0.8 |
| 31 | 111 11 | 0.375 | E2, E4 | Min | −6.2 |

It should be also noted that, the output of the regulator adjusts to hold a specific voltage at the source of N1. It is done by adjusting the gate voltage on N2 until it sinks the exact amount of current provided by the reference current. The reference voltage is required to compensate the output impedance of the drive transistors of each amplifier cells (N1 etc).

As stated above, this invention allows for accurate power control steps, in this case 1 dB. This control structure attempts to remove power fluctuations caused by process parameters, supply voltage reference, and temperature variations while providing a wide dynamic range of power control, in this case 32 dB.

Having described the invention with regard to certain specific embodiments, it is to be understood that these embodiments are not meant as limitations of the invention. Indeed, various modifications and/or adaptations may become apparent to those skilled in the art without departing from the scope of the annexed claims.

The invention claimed is:

1. A power amplifier comprising:
an amplifier core comprising parallel amplifier cells;
a replica cell comprising one amplifier cell similar to those of the amplifier core;
a power controller disposed to select a combination of amplifier cells to activate;
a regulator disposed to fix a top voltage of said replica cell to a reference voltage;
a voltage generator disposed to provide the voltage reference to the regulator;
a current generator disposed to provide a reference current through the replica cell; and
a drive unit controlled by the regulator output to drive the combination of amplifier cells,
wherein each selected combination of activated amplifier cells defines a predetermined attenuation level of power amplifier output signal so that it is attenuated in a stepwise manner.

2. The power amplifier of claim 1, wherein said power controller selects said reference current between a defined number of current levels to attenuate said power amplifier output signal with a corresponding number of attenuation levels.

3. The power amplifier of claim 2, wherein combinations of activated cells define rough attenuation steps and each current level of said reference current defines a fine attenuation step.

4. The power amplifier of claim 3, wherein said reference current is selected between a predetermined number of current levels to attenuate said power amplifier output signal by step of one decibel with respectively n attenuation levels.

5. The power amplifier of claim 4, wherein said amplifier core comprises different combinations of amplifier cells defining a number of different attenuation levels by step of n decibels of said power amplifier output signal.

6. The power amplifier of claim 1, wherein said power controller is disposed to switch in amplifier cells of said combination and to switch out amplifier cells which are not part of said combination.

7. The power amplifier of claim 1, wherein said amplifier cells are cascoded drivers.

8. The power amplifier of claim 1, wherein said regulator is a voltage comparator having inputs and is disposed to receive at the inputs said top voltage of said replica cell and said reference voltage, so that said regulator is disposed to deliver a regulator output voltage limiting excursion of said drive unit.

9. The power amplifier of claim 8, wherein said drive unit comprises inverters to drive said amplifier cells.

10. The power amplifier of claim 1, wherein said power controller is disposed to select said reference voltage to compensate voltage variations at the power amplifier output signal.

11. A method to control power amplifier output of a power amplifier comprising an amplifier core including parallel amplifier cells and a replica cell made of one amplifier cell similar to those of the amplifier core, wherein the method comprises the steps of:
providing a reference voltage by means of voltage generator,
providing a reference current through the replica cell by means of a current generator,
fixing a top voltage of said replica cell to said reference voltage by means of a regulator;
selecting a combination of amplifier cells to be activated by means of a power controller,
driving the selected combination of amplifier cells by means of a drive unit controlled by said regulator,
attenuating in a stepwise manner level of power amplifier output signal by means of the selected combination of amplifier cells.

12. The method of claim 11, further comprising the steps of selecting said reference current between a defined number of current levels by means of the power controller, and attenuating said power amplifier output signal with a corresponding number of attenuation levels.

13. The method of claim 12, wherein combinations of activated cells define rough attenuation steps and each current level of said reference current defines a fine attenuation step.

* * * * *